(12) United States Patent
Iida

(10) Patent No.: US 9,713,247 B2
(45) Date of Patent: Jul. 18, 2017

(54) ROBOT

(71) Applicant: Seiko Epson Corporation, Tokyo (JP)

(72) Inventor: Izumi Iida, Shiojiri (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/886,477

(22) Filed: Oct. 19, 2015

(65) Prior Publication Data

US 2016/0120021 A1 Apr. 28, 2016

(30) Foreign Application Priority Data

Oct. 24, 2014 (JP) ................................. 2014-217043

(51) Int. Cl.
*H05K 9/00* (2006.01)
*H05K 1/02* (2006.01)
(Continued)

(52) U.S. Cl.
CPC .......... *H05K 1/025* (2013.01); *B25J 19/0029* (2013.01); *H05K 1/028* (2013.01);
(Continued)

(58) Field of Classification Search
CPC ...... H05K 1/0216; H05K 1/025; H05K 1/028; H05K 1/142; H05K 2201/042; B25J 19/0029; Y10S 901/28
See application file for complete search history.

(56) References Cited

U.S. PATENT DOCUMENTS 3,612,744 A 10/1971 Thomas
7,807,927 B2 * 10/2010 Yeh ...................... H01B 7/0838
174/110 R (Continued)

FOREIGN PATENT DOCUMENTS

JP 06-021681 A 1/1994
JP 2004-029652 A 1/2004
(Continued)

OTHER PUBLICATIONS

Extended European Search Report for Application No. EP 15 19 0994 dated Mar. 14, 2016 (9 pages).

*Primary Examiner* — Hoa C Nguyen
(74) *Attorney, Agent, or Firm* — Harness, Dickey & Pierce, P.L.C.

(57) ABSTRACT

A robot includes: a wiring board which is a flexible printed wiring board including a first board wiring line through which current having a first frequency flows in a wiring direction and a second board wiring line through which current having a second frequency which is a frequency smaller than the first frequency flows in the wiring direction; and a shield board which is a flexible printed wiring board including a conductor and which is overlapped with the wiring board in a thickness direction, in which, in an orthogonal direction which is orthogonal to the wiring direction and the thickness direction, a first conductor edge which is one end portion of the conductor, the first board wiring line, the second board wiring line, a second conductor edge which is another end portion of the conductor are lined in this order, and a distance from the second conductor edge to the second board wiring line is shorter than a distance from the first conductor edge to the first board wiring line.

20 Claims, 7 Drawing Sheets

(51) Int. Cl.
 *B25J 19/00* (2006.01)
 *H05K 1/14* (2006.01)

(52) U.S. Cl.
 CPC ......... *H05K 1/0216* (2013.01); *H05K 1/0219* (2013.01); *H05K 1/142* (2013.01); *H05K 2201/042* (2013.01); *Y10S 901/28* (2013.01)

(56) References Cited

U.S. PATENT DOCUMENTS

| | | | | |
|---|---|---|---|---|
| 8,338,709 | B2* | 12/2012 | Kodama | H01B 7/0838 174/110 R |
| 8,581,103 | B2* | 11/2013 | Aspas Puertolas | H05K 1/142 174/251 |
| 2008/0116988 | A1 | 5/2008 | Blair et al. | |
| 2008/0236868 | A1* | 10/2008 | Koga | H01B 7/0861 174/117 F |
| 2013/0056248 | A1* | 3/2013 | Kajiya | H05K 1/028 174/254 |
| 2014/0375394 | A1* | 12/2014 | Lin | H01P 1/22 333/1 |

FOREIGN PATENT DOCUMENTS

| | | |
|---|---|---|
| JP | 2008-210839 A | 9/2008 |
| JP | 2010-214528 A | 9/2010 |
| JP | 2010-214530 A | 9/2010 |
| JP | 2012-045631 A | 3/2012 |
| JP | 2012-060043 A | 3/2012 |
| JP | 2012-160596 A | 8/2012 |
| JP | 2013-187248 A | 9/2013 |

\* cited by examiner

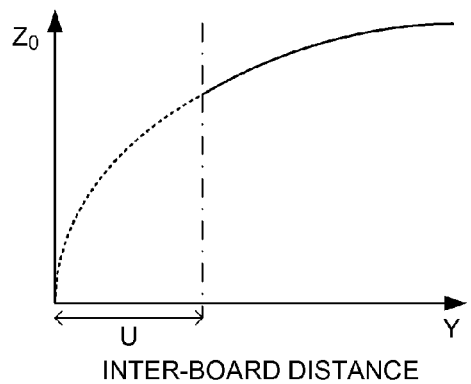
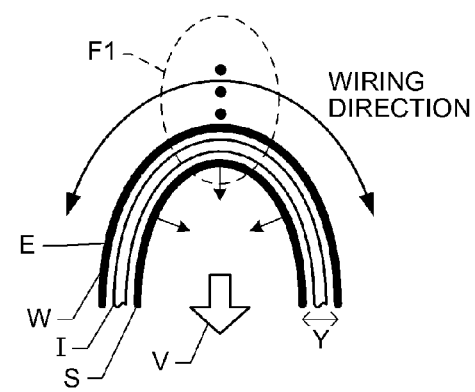
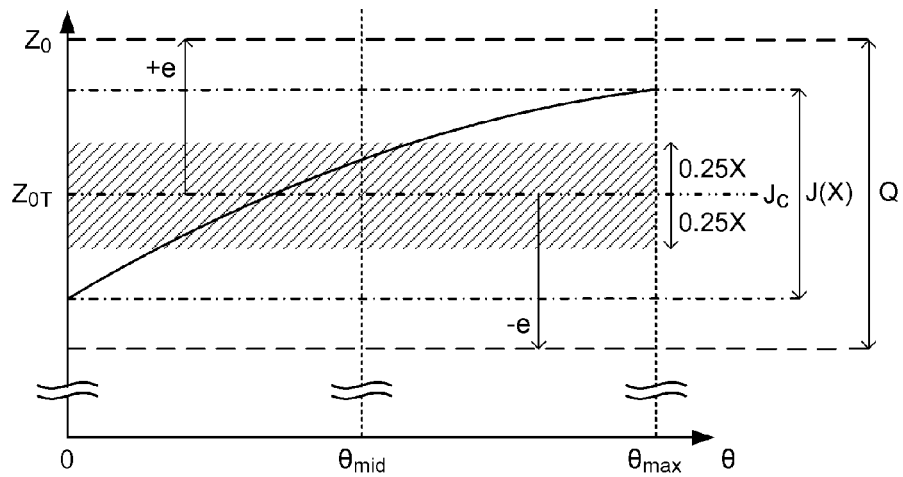
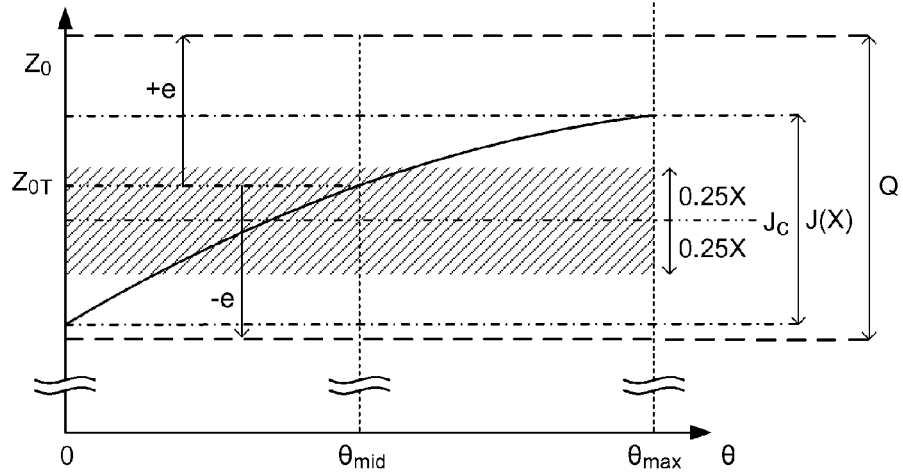
FIG. 6A
FIG. 6D
FIG. 6B
FIG. 6C

ROBOT

BACKGROUND

1. Technical Field

The present invention relates to a robot.

2. Related Art

A technology of using a flexible printed wiring board in wiring in arms of a robot has been known (see JP-A-2010-214530). In addition, a technology of matching characteristic impedance of wiring on a flexible printed wiring board with characteristic impedance of coated wiring connected to the wiring has been known (see JP-A-2008-210839).

However, even when the characteristic impedance is adjusted so as to be matched with the coated wiring at the time of manufacturing, the position of the flexible printed wiring board is shifted from the position at the time of manufacturing when arms are repeatedly moved, and as a result, the characteristic impedance becomes inappropriate.

SUMMARY

An advantage of some aspects of the invention is to provide a robot which can maintain characteristic impedance appropriately, even when the robot is repeatedly moved.

A robot according to an aspect of the invention includes: a wiring board which is a flexible printed wiring board including a first board wiring line through which current having a first frequency flows in a wiring direction and a second board wiring line through which current having a second frequency which is a frequency smaller than the first frequency flows in the wiring direction; and a shield board which is a flexible printed wiring board including a conductor and which is overlapped with the wiring board in a thickness direction, in which, in an orthogonal direction which is orthogonal to the wiring direction and the thickness direction, a first conductor edge which is one end portion of the conductor, the first board wiring line, the second board wiring line, a second conductor edge which is another end portion of the conductor are lined in this order, and a distance from the second conductor edge to the second board wiring line is shorter than a distance from the first conductor edge to the first board wiring line.

In this configuration, when the robot is repeatedly moved, the positions of the wiring board and the shield board are shifted in the orthogonal direction of the wiring direction and a state where a conductor on the shield board and the board wiring line on the wiring board are overlapped each other in a thickness direction is transitioned to a state where the conductor and the board wiring line are not overlapped each other. When the state is transitioned to a state where conductor on the shield board and the board wiring line on the wiring board are not overlapped each other, a distance from the board wiring line on the wiring board to the closest conductor largely changes, and accordingly, characteristic impedance of the board wiring line on the wiring board largely changes. Therefore, when the robot is repeatedly moved, the characteristic impedance of the board wiring line on the wiring board may change from magnitude at the time of manufacturing.

Here, when a distance from the first conductor edge to the first board wiring line in the orthogonal direction of the wiring direction is set as $D_{11}$, a distance from the first board wiring line to the second board wiring line in the orthogonal direction of the wiring direction is set as $D_{12}$, and a distance from the second conductor edge to the second board wiring line in the orthogonal direction of the wiring direction is set as $D_{22}$, a relationship of $D_{22}<D_{11}$ is satisfied. The order of disposition of each constituent element in the orthogonal direction of the wiring direction is as follows.

First Conductor Edge/$D_{11}$/First Board Wiring Line/$D_{12}$/Second Board Wiring Line/$D_{22}$/Second Conductor Edge Here, conditions for realizing that the second board wiring line is not overlapped with the conductor of the shield board in the thickness direction are movement of the second conductor edge to the first conductor edge side by the distance $D_{22}$ and movement of the first conductor edge to the second conductor edge side by the distance $D_{12}+D_{11}$ in the orthogonal direction of the wiring direction. Since the distance $D_{22}$ is shorter than the distance $D_{11}$ and the distance $D_{12}+D_{11}$ is longer than the distance $D_{11}$, a shortest movement distance of the shield board is set as the distance $D_{22}$ so that the second board wiring line is not overlapped with the conductor of the shield board in the thickness direction. Meanwhile, conditions for realizing that the first board wiring line is not overlapped with the conductor of the shield board in the thickness direction are movement of the first conductor edge to the second conductor edge side by the distance $D_{11}$ and movement of the second conductor edge to the first conductor edge side by the distance $D_{22}+D_{12}$ in the orthogonal direction of the wiring direction. Here, since a relationship of $D_{22}<D_{11}$ is satisfied, both the movement distances $D_{11}$ and $D_{22}+D_{12}$ of the shield board for realizing that the first board wiring line is not overlapped with the conductor of the shield board in the thickness direction are longer than the distance $D_{22}$. That is, the movement distances $D_{11}$ and $D_{22}+D_{12}$ of the shield board for realizing that the first board wiring line is not overlapped with the conductor of the shield board in the thickness direction are longer than the shortest movement distance $D_{22}$ of the shield board for realizing that the second board wiring line is not overlapped with the conductor of the shield board in the thickness direction.

As described above, when the positions of the wiring board and the shield board are shifted in the orthogonal direction of the wiring direction, it is possible to reduce a possibility that the first board wiring line having a high frequency of current is not overlapped with the conductor in the thickness direction, compared to the second board wiring line. That is, it is possible to suitably maintain characteristic impedance of the first board wiring line having a great effect of a change in characteristic impedance, than the second board wiring line with priority.

In addition, the wiring board and the shield board may be formed in a spiral shape in the orthogonal direction. By forming the wiring board and the shield board in a spiral shape, it is possible to dispose the wiring board and the shield board in a compact state, even when the wiring board and the shield board are formed to be long in the wiring direction. When the wiring board and the shield board are formed to be long in the wiring direction as described above, the positions of the wiring board and the shield board are easily shifted in the orthogonal direction of the wiring direction, but it is possible to suitably maintain the characteristic impedance of the first board wiring line with the reasons described above with priority.

Further, the wiring board and the shield board may be folded at a folding line in a direction not orthogonal to the direction of the first conductor edge and the second conductor edge. By folding the wiring board and the shield board, it is possible to change the wiring direction and to increase a degree of disposition freedom of the wiring board and the shield board. When the wiring board and the shield board are folded at the folding line in the direction not orthogonal to the direction of the first conductor edge and the second conductor edge as described above, the positions of the wiring board and the shield board are easily shifted in the orthogonal direction of the wiring direction, but it is possible to suitably maintain the characteristic impedance of the first board wiring line with the reasons described above.

In addition, the first board wiring line may be a signal line and the second board wiring line may be a power source line. In this case, it is possible to suitably maintain the characteristic impedance of the signal line as the first board wiring line in preference to the power source line as the second board wiring line. That is, it is possible to prevent an erroneous operation of the robot by suitably maintaining the characteristic impedance of the signal line. The power source line may transmit a DC power source having a frequency of 0. The power source line may transmit an AC power source.

Further, both of the first board wiring line and the second board wiring line may be signal lines. In this case, it is possible to suitably maintain the characteristic impedance of the first board wiring line through which current having a higher frequency than that of the second board wiring line flows with priority. That is, it is possible to prevent an erroneous operation of the robot by suitably maintaining the characteristic impedance of the signal line having a high frequency.

In addition, the wiring board includes a third board wiring line through which current having a third frequency which may be a lower frequency than the first frequency flows in the wiring direction, and the first board wiring line may be positioned between the second board wiring line and the third board wiring line. In this case, the order of disposition of each constituent element in the orthogonal direction of the wiring direction is as follows.
First Conductor Edge/Third Board Wiring Line/First Board Wiring Line/Second Board Wiring Line/Second Conductor Edge When each board wiring line is shifted to the first conductor edge side, the first board wiring line is overlapped with the conductor in the thickness direction before the third board wiring line. Meanwhile, when each board wiring line is shifted to the second conductor edge side, the first board wiring line is overlapped with the conductor in the thickness direction before the second board wiring line. Therefore, it is possible to maintain a suitable magnitude of the characteristic impedance of the first board wiring line having a higher frequency of current than those of both of the second board wiring line and the third board wiring line, with priority.

BRIEF DESCRIPTION OF THE DRAWINGS

The invention will be described with reference to the accompanying drawings, wherein like numbers reference like elements.

FIG. 6A is a graph showing a relationship between an inter-board distance and characteristic impedance, FIGS. 6B and 6C are graphs showing a relationship between a rotation angle and characteristic impedance, and FIG. 6D is a schematic view of a folding line of the board bundle.

DESCRIPTION OF EXEMPLARY EMBODIMENTS

Figure 1:
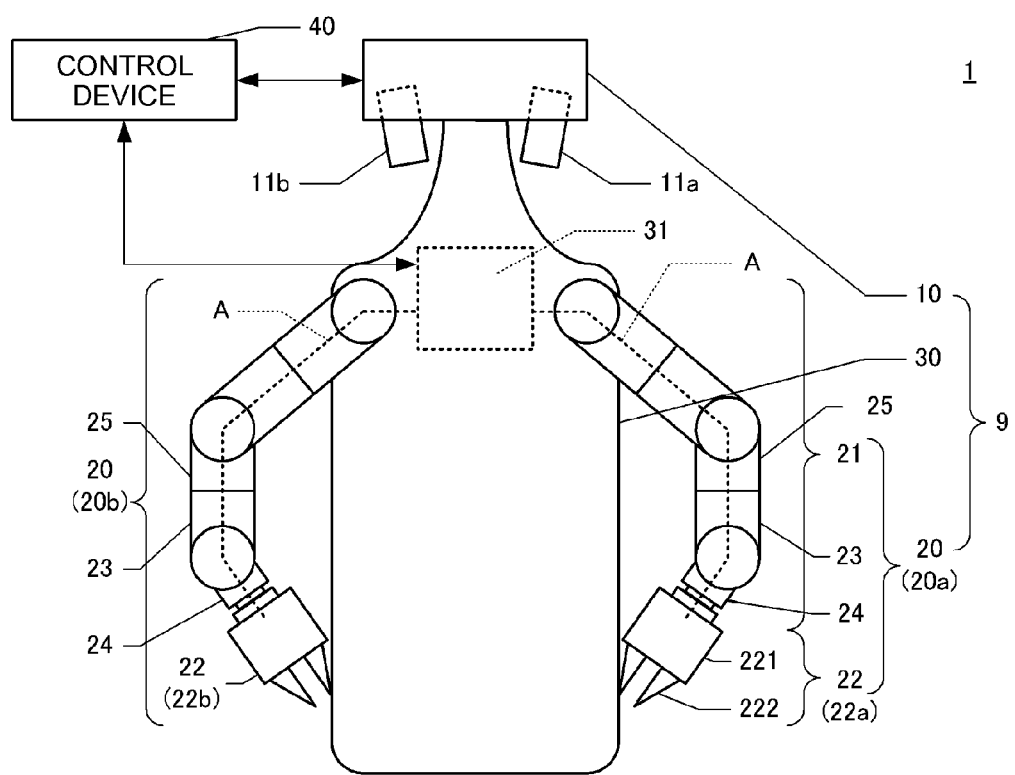
FIG. 1 is a front view of a robot system of one embodiment of the invention.

Hereinafter, embodiments of the invention will be described with reference to the accompanying drawings in the following order. The same reference numerals are used for corresponding constituent elements in each drawing and overlapped description will be omitted.
1. Overall Configuration
2. Configuration of Distal End Portion of Arm
3. Configuration of Transmission Path
4. Measurement Method of Characteristic Impedance
5. Other Embodiments 1. Overall Configuration FIG. 1 is a front view of a robot system 1 of one embodiment of the invention. A robot system 1 includes a robot 9 and a control device 40. The control device 40 is connected to the robot 9 so as to perform communication. This connection is based on wired communication standard such as Ethernet (registered trademark) or Universal Serial Bus (USB) or wireless communication standard such as Wi-Fi (registered trademark). The robot 9 includes an imaging unit 10, hand units 20a and 20b, and a body unit 30. That is, the robot 9 is a dual arm robot including the two hand units 20a and 20b.

The robot 9 acquires a control signal from the control device 40 and performs a predetermined operation with respect to a work based on the acquired control signal. The predetermined operation is, for example, an operation of grasping a work with the hand unit 20 and moving the grasped work from a currently installed position to another position or assembling the work into another device after moving.

The imaging unit 10 is provided on the upper portion of the body unit 30. The imaging unit 10 is, for example, configured with cameras 11a and 11b each including a lens and an imaging element such as a charge coupled device (CCD) or a complementary metal oxide semiconductor (CMOS). The imaging unit 10 images a work which is placed on a working table or a work which is grasped by the hand unit 20 and outputs an captured image of the work to the control device 40 through communication. The robot 9 may not include the imaging unit and may communicate with an external imaging device corresponding to the imaging unit 10.

The hand unit 20 is linked to two portions of the upper portion of the body unit 30. The hand unit 20 includes at least an arm 21 including links of three axes and a hand 22 which is connected to the distal end portion of the arm 21 with a degree of freedom of one axis. Each axis of the hand unit 20 is driven by an actuator (not shown). The hand 22 of the embodiment includes a plurality of fingers 222 which grasp a work and a palm 221 to which the fingers 222 are linked so as to be driven.

A control board 31 is provided in the body unit 30 and a control signal is input to the control board 31 from the control device 40. The control board 31 includes a circuit which generates a driving signal for driving an actuator of each axis included in the hand unit 20 based on a control signal from the control device 40 and an angle signal from an encoder attached to the actuator of each axis. In addition, the control board 31 includes a communication circuit for transmitting and receiving a hand control signal to and from the hand 22. A power source generated from a commercial power supply (not shown) is supplied to the control board 31 and a frame ground (FG) potential which is a potential of a housing of the robot 9 is input to the control board. A transmission path A is drawn from the control board 31 and the transmission path A reaches the distal end of the arm 21.

The transmission path A includes a signal line for transmitting the driving signal for driving the actuator of each axis included in the hand unit 20, the angle signal from the encoder attached to the actuator of each axis, and the hand control signal to the hand 22. The transmission path A further includes a power source line for transmitting the power source and an FG line having the same potential as that of the housing of the robot 9. In addition, the distal end of the transmission path A is connected to a control circuit included in the hand 22. Accordingly, it is possible to supply the hand control signal, the FG potential, or the power source to the control circuit which controls each movable unit of the hand 22. In addition, the transmission path A is branched in the middle of the arm 21 and connected to the driving circuit which drives the actuator of each axis included in the arm 21 and the encoder. Accordingly, it is possible to supply the driving signal, the FG potential, or the power source to the driving circuit which drives the actuator of each axis included in the arm 21 and to acquire the angle signal from the encoder. The control board 31 may separately be provided for each of the right and left hand units 20a and 20b.

2. Configuration of Distal End Portion of Arm

Figure 2A:
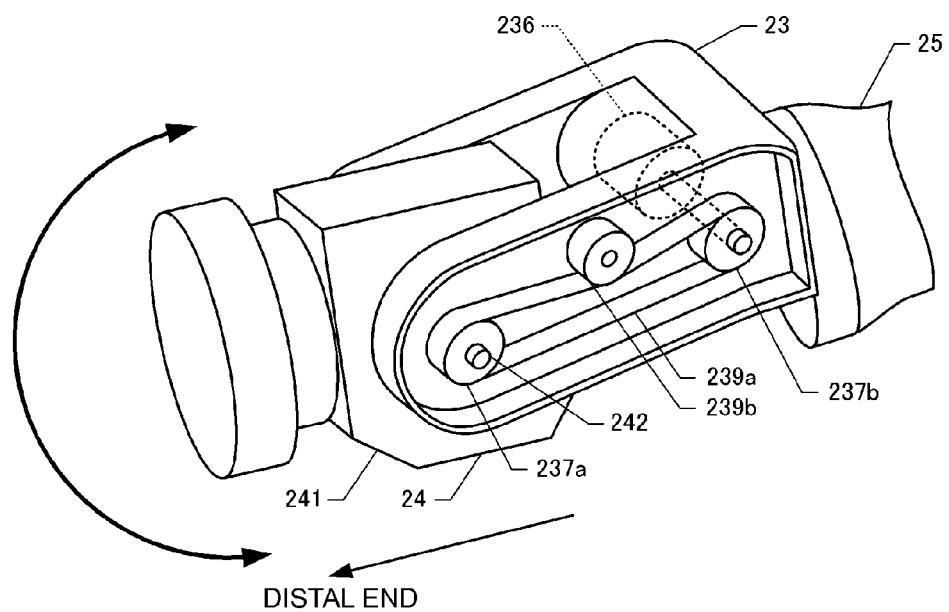
FIGS. 2A and 2B are perspective projection views of the inside of a distal end portion of an arm.
Figure 2B:
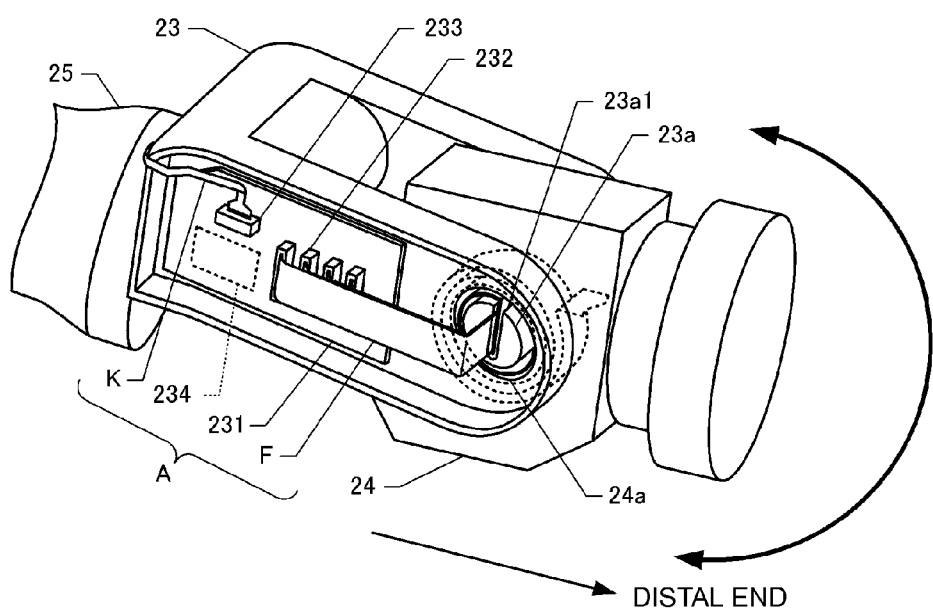

FIGS. 2A and 2B are perspective projection views of the inside of the distal end portion of the arm 21. The distal end portion of the arm 21 includes a first member 23 and a second member 24. The hand 22 can be linked to the distal end of the second member 24 so as to be rotated. The second member 24 is provided to be moved with respect to the first member 23. Specifically, the second member 24 is linked to the first member 23 so as to rotate and move with respect to the first member.

First, a configuration of rotating and moving the second member 24 with respect to the first member 23 will be described. As shown in FIG. 2A, the first member 23 and the second member 24 are linked to each other through a cylindrical rotation shaft 242. The rotation shaft 242 is protruded from the second member 24 and the rotation shaft 242 is supported at a penetration hole (not shown) which is formed on the first member 23. A cylindrical driven pulley 237a is bonded to the rotation shaft 242. By rotating the driven pulley 237a, the rotation shaft 242 to which the driven pulley 237a is bonded is rotated and the second member 24 can be rotated and moved.

The power for rotating the driven pulley 237a is generated by a motor 236. The motor 236 drives by receiving the supply of the power source and the driving signal transmitted by the transmission path A. A cylindrical driving pulley 237b is bonded to a driving shaft of the motor 236 and the driving pulley 237b and the driven pulley 237a are linked to each other by a belt 239a. Accordingly, it is possible to drive the driven pulley 237a with the power of the motor 236. A pulley 239b is provided so as to come into contact with the belt 239a and tension of the belt 239a is appropriately adjusted by the pulley 239b.

3. Configuration of Transmission Path

Next, a portion of the transmission path A which connects the first member 23 and the second member 24 to each other will be described. As described above, the second member 24 rotates and moves with respect to the first member 23, and the transmission path A is configured so as to allow the rotation and movement. FIG. 2B shows a state of the first member 23 and the second member 24 which are seen from the opposite side of FIG. 2A. A circular penetration hole 24a is formed on a side surface of the second member 24 and the internal space of the first member 23 and the internal space of the second member 24 are linked to each other through the penetration hole 24a. A winding core 23a having an approximate cylindrical shape is provided on the first member 23 and the winding core 23a is inserted into the internal space of the second member 24 through the penetration hole 24a. A cross section of the winding core 23a configures a concentric circle with a cross section of the rotation shaft 242. A groove 23a1 is formed by cutting the winding core 23a in a diameter direction and a board bundle F is inserted into the groove 23a1. The board bundle F is a bundle of flexible printed wiring boards and will be specifically described later.

A connection board 231 is accommodated in the first member 23 and a connector 233 is mounted on the connection board 231. A terminal of connection wiring K is connected to the connector 233. The connection wiring K is a cable obtained by coating a conductor with an insulator and may be a commercially available local area network (LAN) cable or the like. The connection wiring K is a cable derived from an arm member 25 which is linked to the body unit 30 side compared to the first member 23, and configures a part of the transmission path A. A plurality of connectors 232 are mounted on the connection board 231 and a terminal of each flexible printed wiring board configuring the board bundle F is connected to the connector 232. A pattern (not shown) for connecting the connector 233 of the connection wiring K and the connectors 232 of the board bundle F is formed on the connection board 231 and a connection circuit 234 configuring an attenuator is formed between the connector 233 and the connectors 232. The connection circuit 234 may be a circuit which performs impedance matching between the connection wiring K and the board bundle F and, for example, may be a circuit in which a plurality of resistors (not shown) are connected in a T type or a π type.

Figure 3:
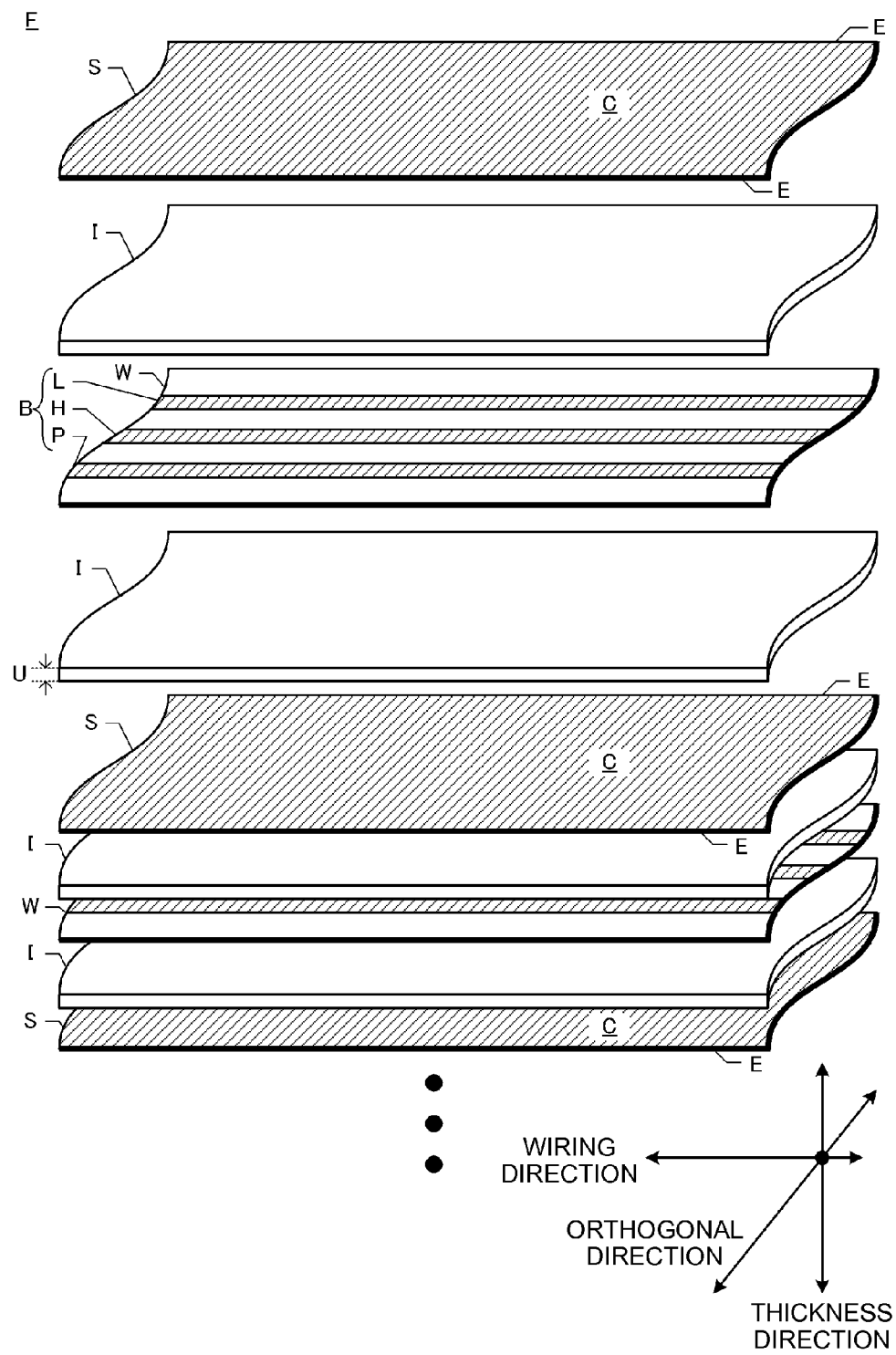
FIG. 3 is a perspective view of a board bundle.

Next, the board bundle F will be described in detail. FIG. 3 is a perspective view showing a configuration of the board bundle F. The board bundle F is formed by overlapping the plurality of flexible printed wiring boards in a thickness direction. A wiring board W and a shield board S are included in the flexible printed wiring boards configuring the board bundle F. The flexible printed wiring board is a printed wiring board having flexibility and may be a board on which a pattern is formed by selectively etching copper foil formed on the entire surface of a base, for example. The flexible printed wiring board of the embodiment is a printed wiring board having a single layer on one side. In the board bundle F, the necessary number of wiring boards W for driving each actuator of the distal end side of the arm 21 compared to the disposition position of the board bundle F is included, and the shield boards S are overlapped so as to interpose each wiring board W from the top and bottom of the paper. In addition, a spacer I having a predetermined thickness U is interposed between the wiring board W and the shield board S.

The wiring board W includes a high frequency signal line H, a low frequency signal line L, and a power source line P as board wiring lines B. Accordingly, the high frequency signal line H and the low frequency signal line L as the board wiring lines B are connected to the connection wiring K through the attenuator (connection circuit 234) and the connectors 232 and 233 and the power source line P as the board wiring line B is connected to the connection wiring K through the connectors 232 and 233. The high frequency signal line H, the low frequency signal line L, and the power source line P have a linear pattern which extends in a wiring direction. The wiring direction means a length direction of the board bundle F and a width direction of the board bundle F means a orthogonal direction which is orthogonal to the wiring direction and the thickness direction of the board bundle F. The high frequency signal line H and the low frequency signal line L are the board wiring lines B which transmits a signal for driving the actuator provided in the distal end side of the arm 21 compared to the second member 24. The power source line P is the board wiring line B which transmits an electrical power to be supplied to the actuator provided in the distal end side of the arm 21 compared to the second member 24. Regarding the frequencies of the signal (current) transmitted through the high frequency signal line H, the low frequency signal line L, and the power source line P, a frequency transmitted through the high frequency signal line H is highest and a frequency transmitted through the power source line P is lowest.

A signal transmitted through the high frequency signal line H may be a digital communication signal which is generated at a predetermined bit rate and a signal transmitted through the low frequency signal line L may be a digital communication signal which is generated at a bit rate lower than that of the signal of the high frequency signal line H. Each of the high frequency signal line H and the low frequency signal line L may be a differential signal line configured with two lines. The current flowing through the power source line P may be an alternating current (AC power source) and may be a direct current (DC power) having a frequency of 0. The signal transmitted through the high frequency signal line H and the low frequency signal line L is not limited to a simple digital communication signal. For example, the signal thereof may be a radio frequency (RF) signal which is modulated by a high frequency carrier, an analog signal, or a signal subjected to pulse with modulation (PWM). In addition, when a bit rate or a carrier frequency is variable, an average value, a maximum value, or a minimum value of a variable frequency band may be a frequency of a modulation signal. In the embodiment, the hand control signal is transmitted to the high frequency signal line H and the encoder signal is transmitted to the low frequency signal line L. Here, the transmission of the electric signal or the power source through the board wiring lines B means that the current flows through the board wiring lines B.

The shield board S is a flexible printed wiring board on which a conductor C having an even thickness is formed over entire board in a plane direction. That is, the shield board S which is a flexible printed wiring board including the conductor C and in which the conductor C is disposed so as to be overlapped with the wiring board W in a thickness direction is provided. The conductor C of the shield board S is electrically connected to a terminal of the FG potential of the control board 31 through the connection wiring K or the like. That is, the conductor C of the shield board S is connected to the ground.

The spacer I is a member having flexibility which is formed on an insulator having an even thickness U. The wiring board W, the shield board S, and the spacer I have the same width and are overlapped so that the end portions in the width direction are assembled. However, in the board bundle F, the wiring board W, the shield board S, and the spacer I are not fixed to each other by bonding or the like. That is, distances between the wiring board W, the shield board S, and the spacer I in the thickness direction are variable and wiring board W, the shield board S, and the spacer I can be shifted in the width direction.

Figure 4A:
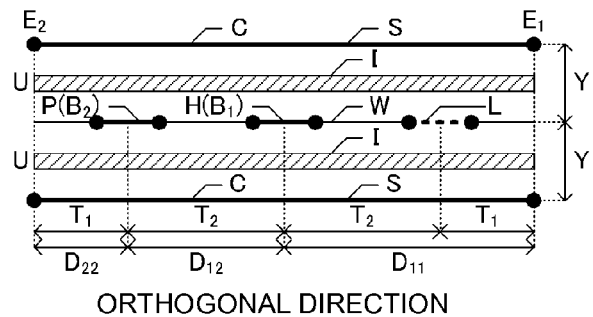
FIGS. 4A to 4D are schematic views showing a positional relationship between board wiring lines and a conductor.
Figure 4B:
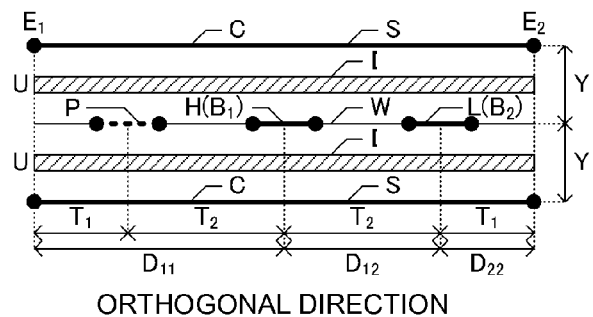
Figure 4C:
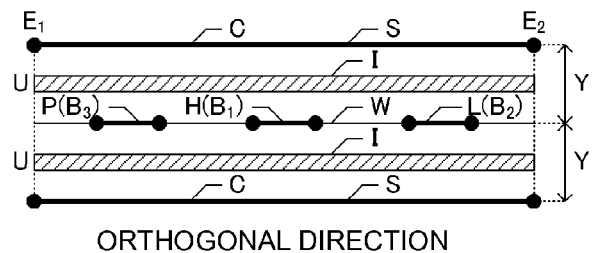

Next, a positional relationship between the board wiring lines B of the wiring board W and the shield board S in the orthogonal direction (width direction of the board bundle F) to the wiring direction will be described. FIGS. 4A to 4C are schematic views of the board bundle F in the wiring direction. As shown in FIGS. 4A to 4C, the power source line P, the high frequency signal line H, and the low frequency signal line L are disposed to be lined in this order from the left side of the paper in the orthogonal direction of the wiring direction. The wiring board W, the shield board S, and the spacer I are overlapped so that the positions of a conductor edge E of the shield board S (conductor C) and edges of the wiring board W and the spacer I coincide with each other in the orthogonal direction of the wiring direction. From the left side of the paper, a distance from the conductor edge E of the conductor C of the shield board S to the power source line P is set as a margin spacing $T_1$, a distance from the power source line P to the high frequency signal line H is set as a conductor spacing $T_2$, a distance from the high frequency signal line H to the low frequency signal line L is set as the conductor spacing $T_2$, and a distance from the low frequency signal line L to the conductor edge E of the conductor C of the shield board S is set as the margin spacing $T_1$. That is, in the embodiment, the high frequency signal line H is positioned on a central line of the board bundle F in the width direction and the power source line P and the low frequency signal line L exist in a position symmetrical to the central line. As described above, by disposing the power source line P, the high frequency signal line H, and the low frequency signal line L in the orthogonal direction of the wiring direction, a relationship regarding the distances described below is satisfied.

In FIG. 4A, a right edge of the conductor C in the paper is considered as a first conductor edge $E_1$. In this case, as shown in FIG. 4A, the first conductor edge $E_1$ which is one end portion (right end of the paper) of the conductor C, the high frequency signal line H as a first board wiring line $B_1$, the power source line P as a second board wiring line $B_2$, and a second conductor edge $E_2$ which is another end portion (left end of the paper) of the conductor C are lined in this order from the right side of the paper in the orthogonal direction of the wiring direction (width direction of the board bundle F). Here, a distance $D_{22}=T_1$ which is from the second conductor edge $E_2$ to the power source line P as the second board wiring line $B_2$ is shorter than a distance $D_{11}=T_1+T_2$ which is from the first conductor edge $E_1$ to the high frequency signal line H as the first board wiring line $B_1$ in the orthogonal direction of the wiring direction (width direction of the board bundle F).

In FIG. 4B, a left edge of the conductor C in the paper is considered as the first conductor edge $E_1$. In this case, as shown in FIG. 4B, the first conductor edge $E_1$ which is one end portion (left end of the paper) of the conductor C, the high frequency signal line H as the first board wiring line $B_1$, the low frequency signal line L as the second board wiring line $B_2$, and the second conductor edge $E_2$ which is another end portion (right end of the paper) of the conductor C are lined in this order from the left side of the paper in the orthogonal direction of the wiring direction (width direction of the board bundle F). Here, the distance $D_{22}=T_1$ which is from the second conductor edge $E_2$ to the low frequency signal line L as the second board wiring line $B_2$ is shorter than the distance $D_{11}=T_1+T_2$ which is from the first conductor edge $E_1$ to the high frequency signal line H as the first board wiring line $B_1$ in the orthogonal direction of the wiring direction (width direction of the board bundle F).

In addition, when a frequency of the current flowing through the high frequency signal line H is set as a first frequency, a frequency of the current flowing through the low frequency signal line L is set as a second frequency, and a frequency of the current flowing through the power source line P is set as a third frequency, both of the second frequency and the third frequency are lower than the first frequency. That is, the wiring board W includes the power source line P as a third board wiring line $B_3$ through which the current having the third frequency which is a frequency lower than the first frequency flows. Accordingly, as shown in FIG. 4C, the high frequency signal line H as the first board wiring line $B_1$ is positioned between the low frequency signal line L as the second board wiring line $B_2$ and the power source line P as the third board wiring line $B_3$ in the orthogonal direction of the wiring direction (width direction of the board bundle F).

Figure 5A:
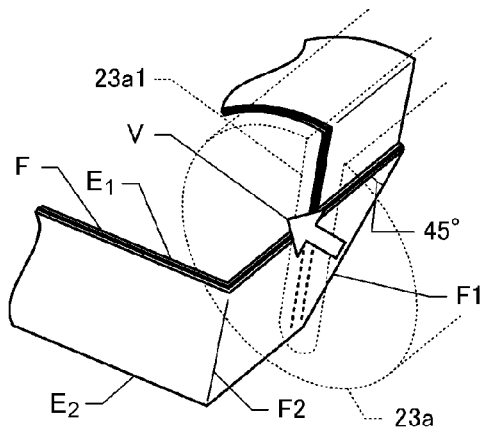
FIG. 5A is a perspective view of a board bundle and FIGS. 5B to 5D are explanatory diagrams of the board bundle.

FIG. 5A is a perspective view showing the shape of the board bundle F. FIG. 5A is an enlarged diagram of the vicinity of the winding core 23a of FIG. 2B. As shown in FIG. 5A, the board bundle F is folded so that a folding line F1 is formed at an angle of 45° with respect to the first conductor edge $E_1$ and the second conductor edge $E_2$. That is, the wiring board W and a shield board S are folded along the folding line F1 in a direction not orthogonal to the direction of the first conductor edge $E_1$ and the second conductor edge $E_2$. By folding the board bundle F, the board bundle F can be inserted into and bound by the groove 23a1 of the winding core 23a and the wiring direction of the wiring board W can be changed by 90°. As described above, by folding the board bundle F, it is possible to change the wiring direction and to increase a degree of disposition freedom of the board bundle F. The board bundle F derived from the groove 23a1 in an axial direction of the winding core 23a is folded so that a folding line F2 orthogonal to the direction of the first conductor edge $E_1$ and the second conductor edge $E_2$ is formed. Meanwhile, the board bundle F derived from the groove 23a1 in the diameter direction of the winding core 23a is wound on a side surface of the winding core 23a and the winding direction of the current is a circumferential direction of the cross section of the winding core 23a.

Figure 5B:
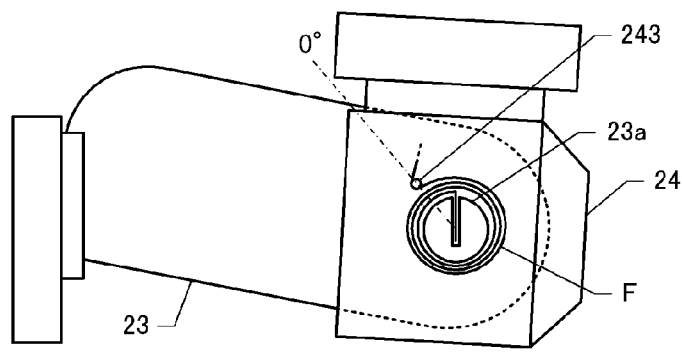
Figure 5C:
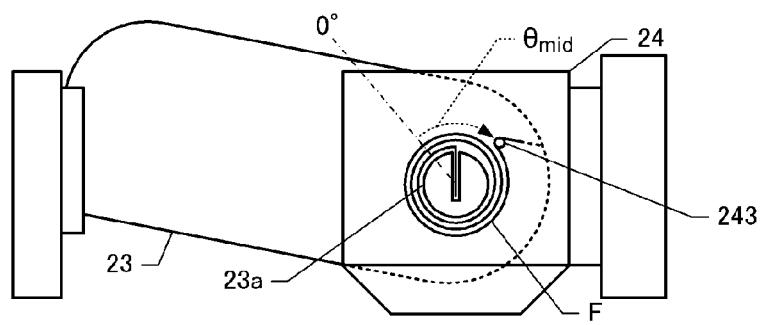
Figure 5D:
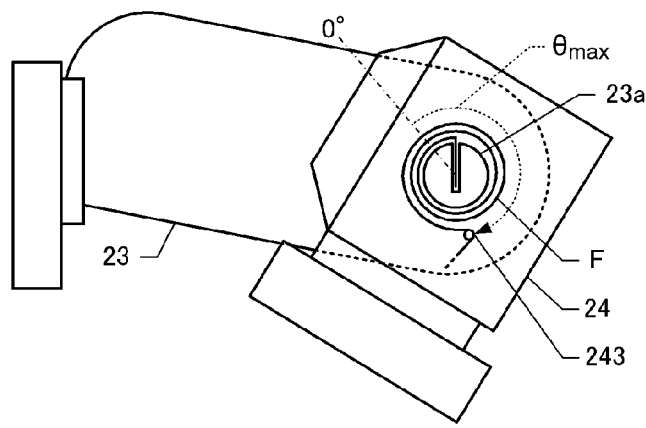

FIGS. 5B to 5D are explanatory diagrams of the board bundle F. As shown in FIGS. 5B to 5D, the board bundle F is wound on the winding core 23a counterclockwise in the paper. In the orthogonal direction which is orthogonal to the wiring direction and the thickness direction of the wiring board W, the wiring board W and the shield board S are formed in a spiral shape. As described above, by setting the board bundle F in a spiral shape, the board bundle F can be disposed in a compact state, even when the board bundle F is formed to be long in the wiring direction. The board bundle F wound on the wiring core 23a is derived towards a fixing point 243 provided on the second member 24 and the board bundle F is fixed to the fixing point 243. When the second member 24 is rotated and moved with respect to the first member 23, the winding core 23a is not rotated and the fixing point 243 is moved on a circular arc track using the winding core 23a as the center. FIG. 5B shows a state where the second member 24 is rotated in counterclockwise of the paper to the end in a movable range and a rotation angle θ of the fixing point 243 at this time is defined as 0°. FIG. 5D shows a state where the second member 24 is rotated in clockwise of the paper to the end in a movable range and a rotation angle θ of the fixing point 243 at this time is defined as $θ_{max}$. FIG. 5C shows a state where the second member 24 is rotated at an intermediate point in a movable range and a rotation angle θ of the fixing point 243 at this time is defined as $θ_{mid}=θ_{max}/2$.

As shown in FIGS. 5B to 5D, as the rotation angle θ of the fixing point 243 is decreased, the fixing point 243 moves in a winding direction (counterclockwise of the paper) and the board bundle F having a spiral shape is clamped. That is, the wiring board W is deformed so as to decrease a winding diameter according to the movement of the second member 24 (decrease in rotation angle θ) with respect to the first member 23. In addition, as the rotation angle θ of the fixing point 243 is decreased, the distance between the constituent elements of the board bundle F in a spiral shape in the thickness direction is decreased and the distance between the wiring board W and a shield board S in the thickness direction (hereinafter, inter-board distance Y) is also decreased. Here, the inter-board distance Y is not equal to or smaller than the thickness U of the spacer I.

In contrast, as the rotation angle θ of the fixing point 243 is increased, the fixing point 243 moves in a direction opposite to the winding direction (counterclockwise of the paper) and the clamping of the board bundle F having a spiral shape is alleviated. Accordingly, as the rotation angle θ of the fixing point 243 is increased, the distance between the constituent elements of the board bundle F in a spiral shape is increased and the inter-board distance Y is also increased.

FIG. 6A is a graph showing a relationship between characteristic impedance of the high frequency signal line H and the inter-board distance Y. A vertical axis of FIG. 6A indicates characteristic impedance $Z_0$ of the high frequency signal line H and a horizontal axis indicates the inter-board distance Y (see FIGS. 4A to 4C). As shown in FIG. 6A, the characteristic impedance $Z_0$ increases as the inter-board distance Y increases, and the characteristic impedance $Z_0$ has a property of decreasing inclination as the inter-board distance Y increases. That is, as the inter-board distance Y has a small range, an amount of change of the characteristic impedance $Z_0$ increases depending on the change in the inter-board distance Y. Here, since the inter-board distance Y is not equal to or smaller than the thickness U of the spacer I, the characteristic impedance $Z_0$ changes only in a range (solid line) corresponding to the inter-board distance Y equal to or greater than the thickness U of the spacer I.

That is, even when the inter-board distance Y changes, the characteristic impedance $Z_0$ changes only in a range to have small inclination, and it is possible to suppress an amount of change in the characteristic impedance $Z_0$. Although not shown, regarding the low frequency signal line L and the power source line P, it is also possible to suppress an amount of change in the characteristic impedance $Z_0$ by the spacer I. As the thickness of the spacer I is great, it is possible to suppress an amount of change in the characteristic impedance $Z_0$ of the high frequency signal line H, and accordingly, it is desirable that the thickness of the spacer I is great in a range where a degree of flexibility of the spacer I is equal to or greater than a predetermined reference. In addition, both of the inter-board distance Y and the degree of flexibility of the spacer I may be satisfied by interposing two or more spacers I between the wiring board W and a shield board S.

The characteristic impedance $Z_0$ of the high frequency signal line H can be dependent on the inter-board distance Y by overlapping the wiring board W and a shield board S in the thickness direction and the characteristic impedance $Z_0$ of the high frequency signal line H can be controlled by controlling the inter-board distance Y. With the shielding effect of the shield board S, it is possible to prevent leakage of noise from the high frequency signal line H to the outside and to prevent the mixing of the noise with the high frequency signal line H from the outside. Regarding the low frequency signal line L and the power source line P, the same effects are obtained.

FIGS. 6B and 6C are graphs showing a relationship between the characteristic impedance of the high frequency signal line H and the rotation angle θ. A vertical axis of FIGS. 6B and 6C indicates the characteristic impedance $Z_0$ and a horizontal axis indicates the rotation angle θ (see FIGS. 5B to 5D). As described above, as the rotation angle θ increases, the inter-board distance Y increases, and accordingly, as the rotation angle θ increases, the characteristic impedance $Z_0$ increases. As shown in FIG. 6B, in the embodiment, characteristic impedance $Z_{0T}$ of the signal line connected to the high frequency signal line H among the connection wiring K is included in a change range J of the characteristic impedance $Z_0$ of the high frequency signal line H (board wiring lines B) according to the change of the wiring board W.

As shown in FIG. 6B, an absolute value of a difference between the characteristic impedance $Z_{0T}$ of the signal line connected to the high frequency signal line H among the connection wiring K and a center value $J_c$ of the change range J is equal to or smaller than 25% of the entire width X of the change range J. The center value $J_c$ of the change range J is an average value (alternate long and two short dashes line of FIG. 6B) of an upper limit value and a lower limit value of the change range J. In FIG. 6B, a range where the absolute value of a difference between the characteristic impedance $Z_{0T}$ of the connection wiring K and the center value is equal to or smaller than 25% of the entire width X of the change range J is shown with hatching. As shown in FIG. 6B, in the embodiment, the characteristic impedance $Z_{0T}$ of the connection wiring K and the center value $J_c$ of the change range J are equivalent to each other. That is, since the absolute value between the characteristic impedance $Z_{0T}$ of the connection wiring K and the center value $J_c$ of the change range J is 0, the absolute value is equal to or smaller than 25% of the entire width X of the change range J.

As shown in FIG. 6B, the change range J is included in an allowable range Q which is set so as to include the characteristic impedance $Z_{0T}$ of the connection wiring K. In the embodiment, the allowable range Q is a range from a lower limit value obtained by subtracting an allowable error e from the characteristic impedance $Z_{0T}$ of the connection wiring K to an upper limit value obtained by adding the allowable error e to the characteristic impedance $Z_{0T}$ of the connection wiring K. The allowable error e is, for example, a value obtained by multiplying a predetermined rate (for example, 10%) by the characteristic impedance $Z_{0T}$ of the connection wiring K. For example, a maximum value and a minimum value of the characteristic impedance $Z_0$ of the high frequency signal line H may be investigated while changing the rotation angle θ and a width or a thickness of the high frequency signal line H may be designed so that the maximum value and the minimum value are in the allowable range Q.

In the embodiment, the characteristic impedance $Z_0$ monotonously increases with respect to the rotation angle θ. Accordingly, as shown in FIG. 6C, a width or a thickness of the high frequency signal line H may be designed so that the characteristic impedance $Z_0$ of the high frequency signal line H becomes the same as the characteristic impedance $Z_{0T}$ of the connection wiring K when the rotation angle θ is the intermediate rotation angle $θ=θ_{mid}/2$. Therefore, it is possible to change the characteristic impedance $Z_0$ of the high frequency signal line H with good balance in the vicinity of the characteristic impedance $Z_{0T}$ of the connection wiring K. That is, since the characteristic impedance $Z_0$ of the high frequency signal line H changes to be biased in a larger range or a smaller range than the characteristic impedance $Z_{0T}$ of the connection wiring K, it is possible to prevent the value to be beyond the allowable range Q. Even in FIG. 6C, an absolute value of a difference between the characteristic impedance $Z_{0T}$ of the signal line connected to the high frequency signal line H among the connection wiring K and the center value $J_c$ of the change range J is equal to or smaller than 25% of the entire width X of the change range J. Even in FIG. 6C, the change range J is included in the allowable range Q which is set so as to include the characteristic impedance $Z_{0T}$ of the connection wiring K.

Since the characteristic impedance $Z_0$ of the high frequency signal line H changes in the change range J, a matching property between the characteristic impedance $Z_0$ of the high frequency signal line H and the characteristic impedance $Z_{0T}$ of the connection wiring K may be deteriorated depending on the rotation angle θ. With respect to this, in the embodiment, since the connection wiring K and the high frequency signal line H are connected to each other through an attenuator (connection circuit 234), it is possible to prevent reflection caused by mismatch of the characteristic impedance $Z_0$ between the connection wiring K and the high frequency signal line H.

As described above, a configuration of matching the characteristic impedance $Z_0$ of the high frequency signal line H with the connection wiring K has been described, but a configuration of matching the characteristic impedance of the power source line P of the low frequency signal line L as the board wiring lines B can also be realized in the same manner.

As described above, the change in the characteristic impedance $Z_0$ with the assumption that the board wiring lines B of the wiring board W are overlapped with the conductor C of the shield board S in the thickness direction has been described. However, when an operation of rotating and moving the second member 24 with respect to the first member 23 is repeatedly performed, the board wiring lines B may not be overlapped with the conductor C of the shield board S in the thickness direction. This is because that, when a force in the orthogonal direction (width direction) of the wiring direction is operated with respect to the wiring board W or the shield board S, there is a possibility that the wiring board W and the shield board S are shifted in the orthogonal direction of the wiring direction. For example, a force for shifting the wiring board W and the shield board S in the orthogonal direction of the wiring direction can be generated when the board bundle F interferes other constituent components of the second member 24 with respect to the first member 23 in the orthogonal direction of the wiring direction.

In addition, the force for shifting the wiring board W and the shield board S in the orthogonal direction of the wiring direction can be generated in the folding line F1 shown in FIG. 5A. FIG. 6D is an enlarged view of the board edge E in the vicinity of the folding line F1. As described above, when the inter-board distance Y changes depending on the change in the rotation angle θ and the inter-board distance Y approaches 0, the board on the outer side presses the board which comes into contact with the inner side of the board on the outer side toward the inner side in the vicinity of folding line F1. In the vicinity of folding line F1, a resultant force V of forces for pressing the board on the inner side is formed in the direction orthogonal to the folding line F1 by forces (black arrow) toward which the board on the outer side presses the board which comes into contact with the inner side of the board on the outer side toward the inner side. As shown in FIG. 5A, when a direction of the folding line F1 is a direction not orthogonal to the direction of the conductor edge E of the shield board S, the resultant force V includes a component of force in a direction not parallel to the conductor edge E, that is, a force for shifting the wiring board W and the shield board S in the orthogonal direction of the wiring direction.

Figure 4D:
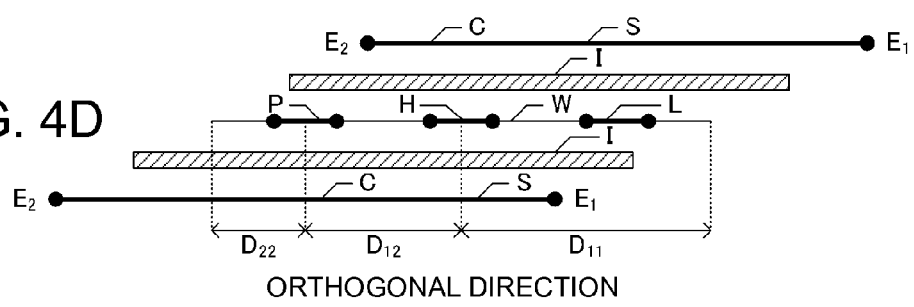

FIG. 4D is a schematic view showing a state where the wiring board W and the shield board S are shifted in the orthogonal direction of the wiring direction. In FIG. 4D, the shield board S on the upper side of the paper is shifted in the right direction of the paper and the shield board S on the lower side of the paper is shifted in the left direction of the paper. As shown in the drawing, the power source line P is not overlapped with the conductor C of the shield board S on the upper side and the low frequency signal line L is not overlapped with the conductor C of the shield board S on the lower side. With respect to this, the high frequency signal line H is overlapped with both of the conductor C of the shield board S on the upper side of the paper and the conductor C of the shield board S on the lower side of the paper, and the change range J of the characteristic impedance $Z_0$ shown in FIG. 6B can be maintained.

As shown in FIG. 4C, since the high frequency signal line H as the first board wiring line $B_1$ is positioned between the low frequency signal line L as the second board wiring line $B_2$ and the power source line P as a third board wiring line $B_3$ in the orthogonal direction of the wiring direction, the characteristic impedance $Z_0$ of the high frequency signal line H can be matched with the connection wiring K in preference to the low frequency signal line L and the power source line P. Therefore, it is possible to reliably transmit a signal having a higher frequency through the high frequency signal line H. Here, as shown in FIG. 4A, since the distance $D_{22}=T_1$ which is from the second conductor edge $E_2$ to the power source line P as the second board wiring line $B_2$ is shorter than the distance $D_{11}=T_1+T_2$ which is from the first conductor edge $E_1$ to the high frequency signal line H as the first board wiring line $B_1$ in the orthogonal direction of the wiring direction, the connection wiring K can be matched with the characteristic impedance $Z_0$ of the high frequency signal line H in preference to the power source line P. As shown in FIG. 4B, since the distance $D_{22}=T_1$ which is from the second conductor edge $E_2$ to the low frequency signal line L as the second board wiring line $B_2$ is shorter than the distance $D_{11}=T_1+T_2$ which is from the first conductor edge $E_1$ to the high frequency signal line H as the first board wiring line $B_1$ in the orthogonal direction of the wiring direction, the connection wiring K can be matched with the characteristic impedance $Z_0$ of the high frequency signal line H in preference to the low frequency signal line L.

4. Measurement Method of Characteristic Impedance

Figure 7A:
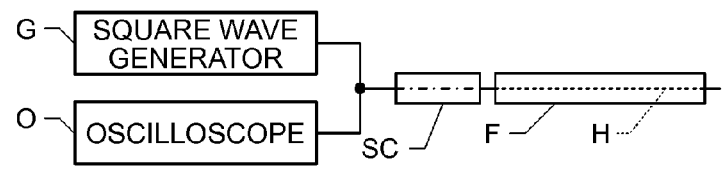
FIG. 7A is an explanatory diagram of a measurement method of characteristic impedance.

FIG. 7A is an explanatory diagram of a device configuration for measuring the characteristic impedance. As shown in FIG. 7A, a square wave generator G, an oscilloscope O, and a standard cable SC are used in order to measure the characteristic impedance of the board bundle F (high frequency signal line H). The square wave generator G is a device which outputs a square wave of a voltage from an output terminal. The standard cable SC is a well-known cable (for example, a coaxial cable) with the characteristic impedance $Z_{SC}$ (for example, 100Ω. A conducting wire (long dashed short dashed line) of the standard cable SC and the high frequency signal line H (broken line) of the board bundle F are connected in series and an end of the high frequency signal line H which is not connected to the conducting wire of the standard cable SC is set as an open terminal. An end of the conducting wire of the standard cable SC which is not connected to the high frequency signal line H is connected to both of an output terminal of the square wave generator G and an input terminal of the oscilloscope O. In the device configuration described above, by changing the shape of the board bundle F in a shape corresponding to each rotation angle θ shown in FIGS. 5B to 5D, the characteristic impedance $Z_0$ of the high frequency signal line H at each rotation angle θ is measured.

Figure 7B:
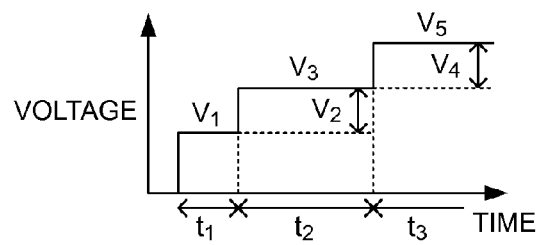
FIG. 7B is a graph of a voltage.

FIG. 7B is a graph of a voltage which is measured by the oscilloscope O. A horizontal axis of FIG. 7B indicates the time and a vertical axis indicates the voltage. First, a predetermined square wave is output from the output terminal of the square wave generator G. An input voltage $V_1$ is measured by the oscilloscope O in a period $t_1$ (period in which the square wave has not arrived at the high frequency signal line H) in which the square wave is being transmitted through the standard cable SC. A voltage $V_3$ which is obtained by adding a reflection wave voltage $V_2$ in a boundary between the standard cable SC and the high frequency signal line H to the input voltage $V_1$ is measured by the oscilloscope O in a period $t_2$ (period in which the square wave has not arrived at the open terminal of the high frequency signal line H) in which the square wave is being transmitted through the high frequency signal line H after the period $t_2$. In addition, a voltage $V_5$ which is obtained by adding a reflection wave voltage $V_4$ in the open terminal of the high frequency signal line H to the voltage $V_3$ is measured by the oscilloscope O in a period $t_3$ after the square wave has arrived at the open terminal of the high frequency signal line H.

The characteristic impedance $Z_0$ of the high frequency signal line H is calculated by the following Equation (1).

$$Z_0=(1+\rho)/(1-\rho)\times Z_{SC} \qquad (1)$$

ρ in Equation (1) is $V_2/V_1$.

5. Other Embodiments

Figure 7C:
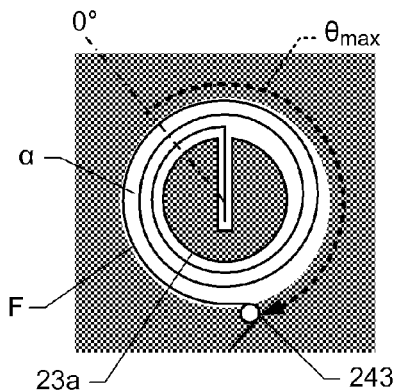
FIGS. 7C and 7D are explanatory diagrams of the board bundle.
Figure 7D:
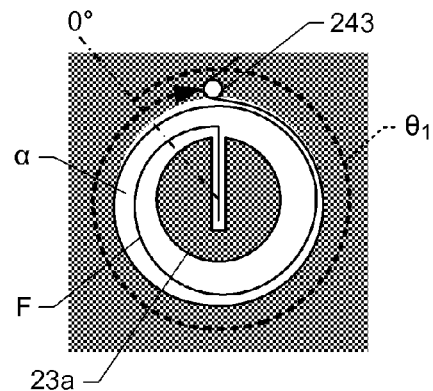

In the embodiment, the characteristic impedance $Z_0$ of the high frequency signal line H monotonously increases according to the rotation angle θ, but the characteristic impedance $Z_1$ may not compulsorily monotonously increase depending on the rotation angle θ. FIGS. 7C and 7D are schematic views showing the board bundle F of other embodiments. An area shown with hatching in FIGS. 7C and 7D indicates an area where the board bundle F is hardly moved. That is, the board bundle F can be moved in a movable area α which is not the area shown with hatching.

When a wall surface having a concentric shape to the wiring core 23a is formed on the first member 23 or the second member 24, the ring-shaped movable area α shown in FIGS. 7C and 7D is formed. When the rotation angle θ is $θ_{max}$ as shown in FIG. 7C, the wall surface for sectioning the movable area α and an outermost peripheral part of the board bundle F do not come into contact with each other and a slight gap is formed therebetween. Accordingly, when the rotation angle θ is increased from 0 to $θ_{max}$, the winding diameter of the board bundle F increases depending on the rotation angle θ, without being limited by the wall surface sectioning the movable area α, and the inter-board distance Y is monotonously increases in the same manner as in FIGS. 5B to 5D of the embodiment. Therefore, when the rotation angle θ is increased from 0 to $θ_{max}$, the characteristic impedance $Z_0$ of the high frequency signal line H also monotonously increases according to an increase in the rotation angle θ, as shown in FIG. 6B.

In other embodiments, the first member 23 and the second member 24 are linked to each other so that the rotation angle θ is increased to be greater than $θ_{max}$. For example, as shown in FIG. 7D, when the rotation angle θ is $θ_1$ ($>θ_{max}$) which is greater than $θ_{max}$ the board bundle F comes into contact with the wall surface sectioning the movable area α and an increase in the winding diameter of the outermost peripheral part of the board bundle F is prevented. Meanwhile, since the winding diameter on the inner side (winding core 23a side) with respect to the outermost peripheral part of the board bundle F increases, a distance between the outermost peripheral part and the inner side of the board bundle F decreases. Accordingly, when the rotation angle θ is increased from $θ_{max}$ to $θ_1$, the inter-board distance Y monotonously decreases according to an increase in the rotation angle θ.

Figure 7E:
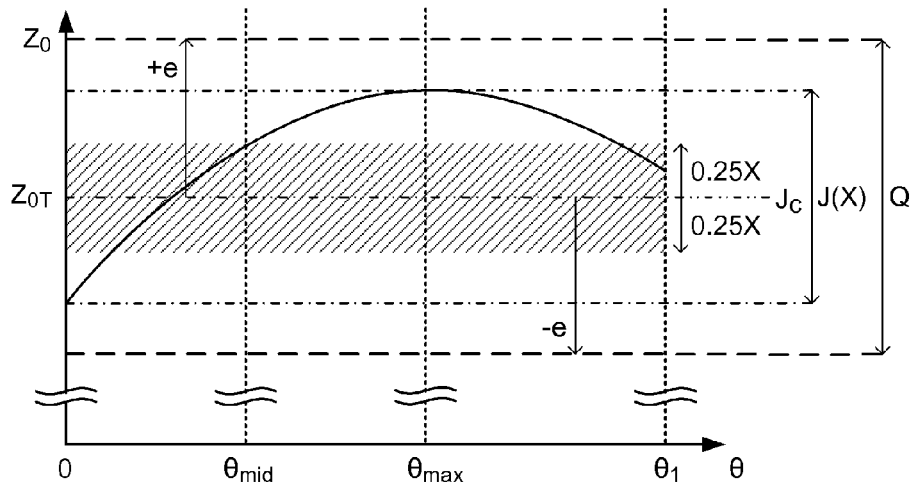
FIG. 7E is a graph showing a relationship between a rotation angle and characteristic impedance.

FIG. 7E is a graph showing a relationship between the characteristic impedance $Z_0$ of the high frequency signal line H and the rotation angle θ of the other embodiment. A vertical axis of FIG. 7E indicates characteristic impedance $Z_0$ and a horizontal axis indicates the rotation angle θ (see FIGS. 5B to 5D and 7C and 7D). As described above, when the rotation angle θ is increased from $θ_{max}$ to $θ_1$, since the inter-board distance Y monotonously decreases according to an increase in the rotation angle θ, the characteristic impedance $Z_0$ also monotonously decreases according to an increase in the rotation angle θ, as shown in FIG. 7E. Accordingly, the characteristic impedance $Z_0$ has a maximum value in a change range (0 to $θ_1$) of the rotation angle θ. Even in such a case, as shown in FIG. 7E, by including the characteristic impedance $Z_{OT}$ of the connection wiring K in the change range J of the characteristic impedance $Z_0$ of the high frequency signal line H, it is possible to match the characteristic impedance even when the second member 24 is moved with respect to the first member 23.

When the characteristic impedance $Z_0$ of the high frequency signal line H has a maximum value, a line width of the high frequency signal line H may be designed so that the maximum value and the characteristic impedance $Z_{OT}$ of the connection wiring K coincide with each other. The characteristic impedance $Z_0$ of the high frequency signal line H may have a minimum value, and a line width of the high frequency signal line H may be designed so that the minimum value and the characteristic impedance $Z_{OT}$ of the connection wiring K coincide with each other. In addition, when the characteristic impedance $Z_0$ of the high frequency signal line H has a maximum value or a minimum value, a line width of the high frequency signal line H may be designed so that the characteristic impedance $Z_0$ of the high frequency signal line H at an intermediate angle in the change range of the rotation angle θ coincides with the characteristic impedance $Z_{OT}$ of the connection wiring K.

The first member 23 and the second member 24 may be members configuring the robot 9. The distal end portion of the arm 21 may not be compulsorily configured and a movable portion other than the arm 21 may be configured. The first member 23 and the second member 24 may be a member (configuration member of the hand 22) which is detachable from the robot 9. In addition, the wiring board W may be deformed to change the characteristic impedance $Z_0$, when the second member 24 is moved with respect to the first member 23, and the deformed state of the wiring board W is not limited to the change in the winding diameter. For example, both ends of the wiring board W formed in a spiral shape may be moved in the axial direction of the winding core. For example, when the second member 24 is moved with respect to the first member 23, a folding angle of the wiring board W which is folded in advance may change. The second member 24 may be linearly moved with respect to the first member 23.

The wiring board W may not be interposed by the shield board S from both sides in the thickness direction, and the shield board S may be overlapped with the wiring board W only from one side in the thickness direction. The shield board S may not be a flexible printed wiring board including the conductor C on the entire surface and may be a flexible printed wiring board partially having the conductor C. The shield board S may include the conductor C having the shielding effect and the conductor C may not be connected to the ground.

The spacer I may not be compulsorily interposed between the wiring board W and a shield board S and the wiring board W and a shield board S may directly come into contact with each other. In this case, an amount of change of the characteristic impedance $Z_0$ of the board wiring lines B increases, but the spacer I may be omitted in such a case where the allowable range J of the characteristic impedance $Z_0$ is great. The spacer I may be configured so as to ensure a distance between the wiring board W and the shield board S, the wiring board W and the shield board S may not compulsorily have the same width, and a hole or a groove may be provided so that deformation resistance decreases. The connection wiring K and the board wiring line B may not be compulsorily connected to each other through an attenuator, and the attenuator may be omitted in such a case where a signal strength of a signal transmitted through the board signal line B is small, for example.

The distance $D_{22}$ from the second conductor edge $E_2$ to the second board wiring line $B_2$ may be smaller than the distance $D_{11}$ from the first conductor edge $E_1$ to the first board wiring line $B_1$ in the orthogonal direction of the wiring direction, and the wiring board W may include at least two board wiring lines B having different frequencies of the current for transmission. The board signal line B may not be the power source line P or the signal lines L or H or may be a ground line. The wiring board W and a shield board S may not be folded at the folding line F1 in a direction not orthogonal to the direction of the first conductor edge $E_1$ and the second conductor edge $E_2$. For example, the wiring board W and a shield board S are shifted in the orthogonal direction of the wiring direction by bringing the first conductor edge $E_1$ or the second conductor edge $E_2$ into contact with the housing and the invention may be applied to this configuration. The high frequency signal line H may not be positioned on the central line of the board bundle F in the width direction and the power source line P and the low frequency signal line L may not exist in the position symmetrical to the central line.

The entire disclosure of Japanese Patent Application No. 2014-217043, filed Oct. 24, 2014 is expressly incorporated by reference herein.

What is claimed is:

1. A robot comprising:
    a wiring board which is configured by a flexible printed wiring board and which extends in a longitudinal direction, the wiring board including:
        a first board wiring line through which current having a first frequency flows, and the first board wiring line extending in the longitudinal direction; and
        a second board wiring line through which current having a second frequency flows, the second board wiring line extending in the longitudinal direction, and the second frequency is lower than the first frequency; and
    a shield board which is configured by a flexible printed wiring board and which extends in the longitudinal direction, the shield board including:
        first and second edges being opposite to each other in a width direction, which is perpendicular to the longitudinal direction, of the shield board; and
        a conductor, wherein the shield board is overlapped with the wiring board in a thickness direction which is perpendicular to the longitudinal direction and the width direction,
    the shield board is slidable relative to the wiring board in the width direction,
    the first board wiring line is closer to the first edge than the second board wiring line in the width direction, and
    a distance from the second edge to the second board wiring line is shorter than a distance from the first edge to the first board wiring line.

2. The robot according to claim 1,
    wherein the wiring board and the shield board are formed in a spiral shape when viewed from the width direction.

3. The robot according to claim 2,
    wherein the first board wiring line is configured with two different first board wiring lines.

4. The robot according to claim 2,
    wherein the second board wiring line is configured with two different second board wiring lines.

5. The robot according to claim 1,
    wherein the wiring board and the shield board are folded at a folding line that does not cross extending lines of the first and second edges.

6. The robot according to claim 5,
    wherein the first board wiring line is configured with two different first board wiring lines.

7. The robot according to claim 5,
    wherein the second board wiring line is configured with two different second board wiring lines.

8. The robot according to claim 1,
    wherein the first board wiring line is a signal line and the second board wiring line is a power source line.

9. The robot according to claim 8,
    wherein the first board wiring line is configured with two different first board wiring lines.

10. The robot according to claim 8,
    wherein the second board wiring line is configured with two different second board wiring lines.

11. The robot according to claim 1,
    wherein both of the first board wiring line and the second board wiring line are signal lines.

12. The robot according to claim 11,
    wherein the first board wiring line is configured with two different first board wiring lines.

13. The robot according to claim 11,
    wherein the second board wiring line is configured with two different second board wiring lines.

14. The robot according to claim 1,
    wherein the wiring board includes a third board wiring line through which current having a third frequency flows, the third board wiring line extends in the longitudinal direction, and the third frequency is lower than the first frequency, and
    the first board wiring line is positioned between the second board wiring line and the third board wiring line in the width direction.

15. The robot according to claim 14,
    wherein the first board wiring line is configured with two different first board wiring lines.

16. The robot according to claim 14,
    wherein the second board wiring line is configured with two different second board wiring lines.

17. The robot according to claim 14,
    wherein the first board wiring line is configured with two different first board wiring lines, and
    the second board wiring line is configured with two different second board wiring lines.

18. The robot according to claim 1,
    wherein the first board wiring line is configured with two different first board wiring lines.

19. The robot according to claim 1,
    wherein the second board wiring line is configured with two different second board wiring lines.

20. The robot according to claim 1,
    wherein the first board wiring line is configured with two different first board wiring lines, and
    the second board wiring line is configured with two different second board wiring lines.

* * * * *